US010592338B2

(12) United States Patent
Danilov et al.

(10) Patent No.: US 10,592,338 B2
(45) Date of Patent: Mar. 17, 2020

(54) SCALE OUT DATA PROTECTION WITH ERASURE CODING

(71) Applicant: EMC IP Holding Company LLC, Hopkinton, MA (US)

(72) Inventors: Mikhail Danilov, Saint Petersburg (RU); Andrey Kurilov, Saint Petersburg (RU)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 1 day.

(21) Appl. No.: 15/965,453

(22) Filed: Apr. 27, 2018

(65) Prior Publication Data

US 2019/0332474 A1    Oct. 31, 2019

(51) Int. Cl.
*G06F 11/10* (2006.01)
*H03M 13/15* (2006.01)
*G06F 11/30* (2006.01)

(52) U.S. Cl.
CPC ....... *G06F 11/1076* (2013.01); *H03M 13/154* (2013.01)

(58) Field of Classification Search
CPC ............ G06F 11/1076; G06F 11/1084; G06F 11/1096; G06F 11/108; H03M 13/154
See application file for complete search history.

(56) References Cited

U.S. PATENT DOCUMENTS

| | | | | |
|---|---|---|---|---|
| 4,726,021 A | * | 2/1988 | Horiguchi | G06F 11/1008 714/718 |
| 5,168,499 A | | 12/1992 | Peterson et al. | |
| 5,383,205 A | * | 1/1995 | Makihara | G06F 11/1008 714/773 |
| 5,768,434 A | | 6/1998 | Ran | |
| 8,417,987 B1 | * | 4/2013 | Goel | G06F 11/1076 714/6.1 |
| 8,595,692 B2 | | 11/2013 | Kalagananam et al. | |

(Continued)

OTHER PUBLICATIONS

Li et al., Preventing Silent Data Corruptions from propagating During Data Reconstruction, IEEE Transactions on Computers, vol. 59, Issue 12, Pertinent pp. 1611-1624 (Year: 2010).*

(Continued)

*Primary Examiner* — Cynthia Britt
*Assistant Examiner* — Dipakkumar B Gandhi
(74) *Attorney, Agent, or Firm* — Amin, Turocy & Watson, LLP

(57) ABSTRACT

Scale out data protection with erasure coding is presented herein. Based on an initial number of storage devices determined to have been included in an initial stage of a data storage cluster, an initial protection scheme for the initial stage can determine first coding fragment(s) for data stored within the data storage cluster to facilitate a first recovery, from the initial stage, of the data using the first coding fragment(s). Further, in response to a defined number of additional storage devices being determined to have been added to the data storage cluster to generate a modified data storage cluster, the initial protection scheme can be modified to obtain a modified protection scheme that can determine, for the modified data storage cluster, second coding fragment(s) for the data to facilitate a second recovery of the data using the first coding fragment(s) and the second coding fragment(s).

20 Claims, 10 Drawing Sheets

(56) References Cited

U.S. PATENT DOCUMENTS

| | | | |
|---|---|---|---|
| 10,284,234 B1 | 5/2019 | Danilov et al. | |
| 2005/0278612 A1* | 12/2005 | Edirisooriya | G06F 11/1076 714/800 |
| 2006/0282716 A1* | 12/2006 | Pomerantz | G06F 11/1076 714/710 |
| 2007/0006019 A1* | 1/2007 | Chien | G06F 11/1076 714/6.12 |
| 2008/0115017 A1* | 5/2008 | Jacobson | G06F 11/1076 714/710 |
| 2009/0083504 A1* | 3/2009 | Belluomini | G06F 11/1076 711/162 |
| 2009/0106583 A1* | 4/2009 | Kawamura | G06F 11/1076 714/6.13 |
| 2012/0284589 A1* | 11/2012 | Kim | G06F 11/1012 714/785 |
| 2013/0173996 A1 | 7/2013 | Anderson et al. | |
| 2013/0227054 A1 | 8/2013 | Zhang et al. | |
| 2015/0249470 A1* | 9/2015 | Roth | H03M 13/293 714/755 |

OTHER PUBLICATIONS

Office Action dated Oct. 3, 2019 for U.S. Appl. No. 15/952,176, 23 pages.

* cited by examiner

SCALE OUT DATA PROTECTION WITH ERASURE CODING

TECHNICAL FIELD

The subject disclosure generally relates to embodiments for scale out data protection with erasure coding.

BACKGROUND

Conventional storage technologies facilitate remote data storage and access via the cloud. However, as the demand for such storage and access has increased, so too has the risk of storage failures and costs associated with recovering data from such failures. In this regard, when storage devices are added to a group of storage devices, e.g., during a scale out of the group, conventional erasure coding technologies manage storage failure risk by performing complete re-coding of the data. Consequently, conventional storage technologies have had some drawbacks, some of which may be noted with reference to the various embodiments described herein below.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

Figure 1:
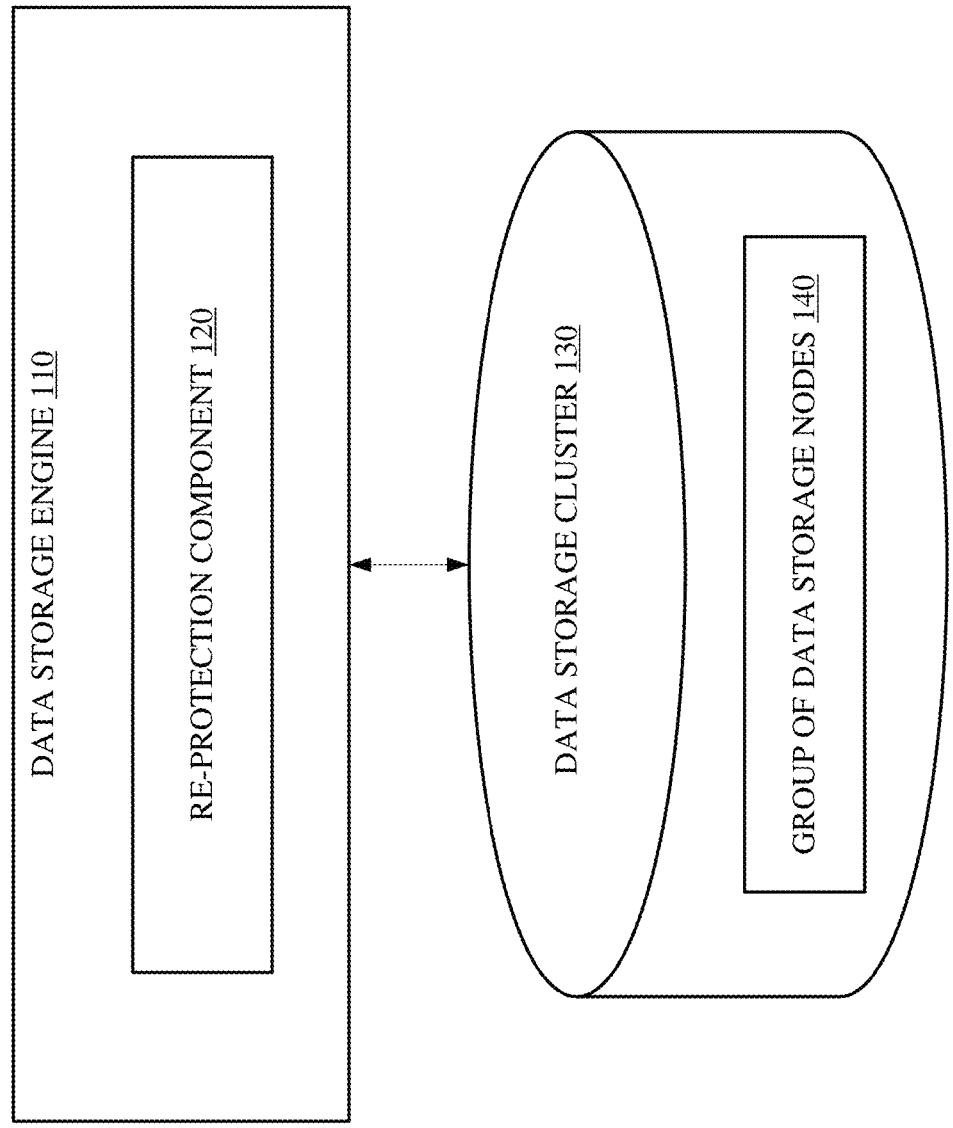
FIG. 1 illustrates a block diagram of a cloud-based data storage system comprising a data storage engine for facilitating scale out data protection with erasure coding, in accordance with various example embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

As described above, conventional erasure coding based storage technologies have had some drawbacks with respect to managing risk of storage failure(s). In this regard, when conventional erasure coding based technologies, e.g., which do not employ mirroring or parity protection, change a protection scheme for data of a storage system when an amount of storage devices of the storage system increases, e.g., during a scale out, such technologies completely re-encode data that has been stored in the storage devices, e.g., deleting old coding fragments of the data, re-computing new coding fragments over all of the data, and storing the new coding fragments in the storage devices—the re-computing of new coding fragments over all of the data utilizing excessive processing overhead, and the storing of the new coding fragments utilizing valuable network and/or communication bandwidth. On the other hand, various embodiments disclosed herein can reduce storage system processing overhead and use of valuable storage device bandwidth in an erasure coding storage environment by performing partial encoding for a data storage cluster.

For example, a system, e.g., comprising a data storage engine, can comprise a re-protection component that can determine an initial protection scheme for an initial stage of a data storage cluster based on an initial number of storage devices (e.g., disk drives) that have been determined to have been included in the initial stage, e.g., storage nodes, of the data storage cluster.

In embodiment(s), the initial protection scheme can comprise an erasure coding-based protection scheme "k+m" in which data, e.g., comprising a data block that has been divided into k data fragments that have been stored within the data storage cluster, and redundant m coding fragments (or an m number of coding fragments) are created for the data block during encoding. In this regard, the initial protection scheme comprises determining a first group of coding fragments (e.g., an $m_1$ amount of coding fragments) for the data block, e.g., for the k data fragments, to facilitate a first recovery, from the initial stage, of the data using the first group of coding fragments.

Further, in response to a defined number of additional storage devices, nodes, etc. being determined to have been added to the data storage cluster to generate a modified data storage cluster, the re-protection component can modify the initial protection scheme to obtain a modified, e.g., erasure coding-based, protection scheme "k+$m_{modified}$" for the modified data storage cluster, in which $m_{modified}=m_1+m_2$ ($m_2$ being an amount of coding fragments for a second group of coding fragments different than the first group of coding fragments). In this regard, the modified protection scheme comprises determining the second group of coding fragments (e.g., the $m_2$ amount of coding fragments), different than the first group of coding fragments, for the data block, e.g., for the k data fragments, to facilitate a second recovery, from the modified data storage cluster, of the data using the first group of coding fragments and the second group of coding fragments.

In an embodiment, $m_{modified}$ is less than or equal to a defined upper limit (e.g., $m_f$) for a number of coding fragments for the data. Further, the $m_1$ amount of coding fragments of the first group of coding fragments is less than $m_{modified}$.

In another embodiment, the initial protection scheme comprises: storing the first group of coding fragments in the data storage cluster to obtain a first stored portion of coding fragments. Further, the modified protection scheme comprises storing the second group of coding fragments in the data storage cluster to obtain a second stored portion of coding fragments. In turn, the re-protection component can recover the data from the modified data storage cluster using the first stored portion (e.g., $m_1$ amount) of coding fragments and the second stored portion (e.g., $m_2$ amount) of coding fragments, e.g., based on the k data fragments that have been stored within the data storage cluster.

In yet another embodiment, a target, e.g., potential final, coding matrix "$m_f \times k$" is based on the defined upper limit (e.g., $m_f$) for the number of coding fragments for the data and a defined amount (e.g., k) of data fragments representing the data. In this regard, the potential final coding matrix comprises a first coding matrix, sub-matrix, etc. "$m_1 \times k$" corresponding to the initial stage of the data storage cluster—the first coding matrix based on the defined amount (e.g., k) of data fragments and the first amount (e.g., $m_1$) of coding fragments of the first group of coding fragments. Further, the potential final coding matrix comprises a second coding matrix, sub-matrix, etc. "$m_{modified} \times k$" corresponding to the modified data storage cluster—the second coding matrix based on the defined amount (e.g., k) of data fragments and the second amount (e.g., $m_2$) of coding fragments of the second group of coding fragments. In this regard, the second sub-matrix comprises the first sub-matrix, e.g., the first sub-matrix is a subset of the second sub-matrix.

In an embodiment, a method can comprise: determining, by a system comprising a processor, a target protection scheme for a data storage cluster—the target protection scheme corresponding to a target coding matrix (e.g., "$m_f \times k$" matrix) for data that has been stored within the data storage cluster; determining, by the system, an initial protection scheme, e.g., an erasure coding-based protection scheme, for an initial stage of the data storage cluster based on an initial number of storage devices that have been included in the initial stage—the initial protection scheme comprising determining a first portion of coefficients (e.g., "$m_1 \times k$" number of coefficients) of the target coding matrix to facilitate a first recovery, from the initial stage of the data storage cluster, of a lost portion of the data.

Further, the method can comprise: in response to determining that a defined number of additional storage devices have been added to the data storage cluster (e.g., via additional storage node(s) that were added to the data storage cluster) to generate a modified data storage cluster, modifying, by the system, the initial protection scheme to obtain a modified protection scheme, e.g., an erasure coding-based protection scheme, for the modified data storage cluster—the modified protection scheme comprising determining a second portion of coefficients (e.g., "$m_2 \times k$" number of coefficients) of the target coding matrix different than the first portion of coefficients, and the first portion of coefficients and the second portion of coefficients facilitating a second recovery, from the modified data storage cluster, of the lost portion of the data.

In one embodiment, the method further comprises recovering, by the system, the lost portion of the data from the modified data storage cluster using the first portion of coefficients and the second portion of coefficients.

In another embodiment, the method further comprises determining, by the system, the target coding matrix based on the defined upper limit (e.g., $m_f$) for the number of coding fragments for the data and the defined number (e.g., k) of data fragments representing, e.g., respective portions of, the data.

In other embodiment(s), the determining of the first portion of coefficients of the target coding matrix and the determining of the second portion of coefficients of the matrix is based on the defined number (e.g., k) of data fragments representing the data.

One embodiment can comprise a machine-readable storage medium comprising instructions that, in response to execution, cause a system comprising a processor to perform operations, comprising: determining a target protection scheme, e.g., an erasure coding-based protection scheme, for a data storage cluster—the target protection scheme corresponding to a defined upper limit of coding fragments for data that has been stored within the data storage cluster; determining, based on an initial number of storage devices that have been determined to have been included in an initial stage of the data storage cluster, an initial protection scheme, e.g., an erasure coding-based protection scheme, for the initial stage of the data storage cluster—the initial protection scheme comprising determining a first portion of the coding fragments to facilitate a first recovery, from the initial stage of the data storage cluster, of the data.

Further, the operations comprise modifying the initial protection scheme to obtain a modified protection scheme, e.g., an erasure coding-based protection scheme, for the modified data storage cluster in response to a defined number of additional storage devices being determined to have been added to the data storage cluster to obtain the modified data storage cluster—the modified protection scheme comprising determining a second portion of the coding fragments that is different than the first portion of the coding fragments, and the first portion of the coding fragments and the second portion of the coding fragments facilitating a second recovery, from the modified data storage cluster, of the data.

In another embodiment, the operations further comprise: storing the first portion of the coding fragments in the data storage cluster to obtain a first stored portion of the coding fragments, e.g., corresponding to a defined amount (e.g., k) of data fragments representing the data; storing the second portion of the coding fragments in the data storage cluster to obtain a second stored portion of the coding fragments, e.g., corresponding to the defined amount (e.g., k) of data fragments representing the data; and recovering the data from the modified data storage cluster using the first stored portion of the coding fragments and the second stored portion of the coding fragments.

As described above, conventional storage technologies have had some drawbacks with respect to incurring excessive processing overhead by re-computing a complete set of erasure-coding based coding fragments of a storage system when a protection scheme for such coding fragments is changed after a scale out of the storage system. Further, conventional storage technologies have had some drawbacks with respect to utilizing valuable storage device and/or network communication bandwidth by storing the complete set of such coding fragments after the scale out of the storage system.

Various embodiments described herein can improve use of storage system resources and reduce storage system processing overhead by performing partial encoding for a data storage cluster associated with scale out. For example, and now referring to FIG. 1, a block diagram of a cloud-based data storage system (100) comprising a data storage engine (110) for facilitating scale out data protection with erasure coding is illustrated, in accordance with various example embodiments.

As used herein, the term "cloud" can refer to a cluster, data storage cluster, etc. comprising a group of nodes, data storage nodes, etc., e.g., comprising a group of network servers (e.g., comprising storage devices, disk drives, etc.), within a distributed, e.g., globally distributed, storage system—the group of storage nodes being communicatively and/or operatively coupled to each other, and hosting a group of applications utilized for servicing user requests. In general, the storage nodes can communicate with user devices via wired and/or wireless communication network(s) to provide access to services that are based in the cloud and not stored locally, e.g., on a user device. A typical cloud-computing environment can include multiple layers, aggregated together, which interact with each other to provide resources for end-users.

Figure 9:
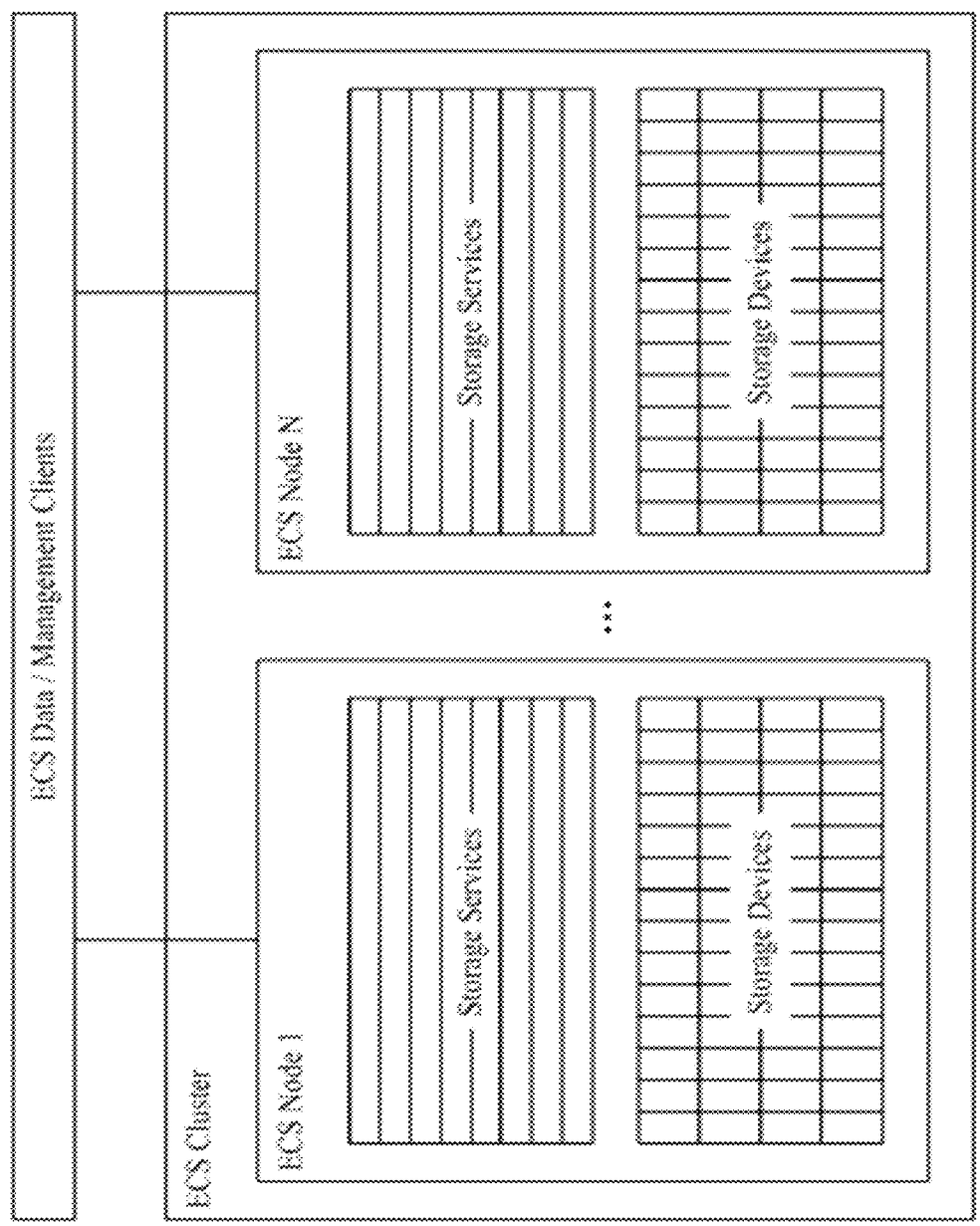
FIG. 9 illustrates an elastic cloud storage (ECS) system, in accordance with various example embodiments.

A scale out, cluster-based, shared-nothing object storage system that employs a microservices architecture pattern, e.g., of an Elastic Cloud Storage (ECS) system, can be utilized in storage environment(s) corresponding to embodiments disclosed herein. For example, FIG. 9 illustrates an ECS storage system comprising a cloud-based object storage appliance in which corresponding storage control software comprising, e.g., ECS data client(s), ECS management client(s), storage service(s), etc. and storage media, e.g., physical magnetic disk media, storage devices, etc. of respective ECS nodes of an ECS cluster, are combined as an integrated system with no access to the storage media other than through the ECS system.

In this regard, as illustrated by FIG. 11, an ECS cluster comprises multiple nodes, storage nodes, ECS nodes, etc. Each node is associated with storage devices, e.g. hard drives, physical disk drives, storage media, etc. In embodiment(s), an ECS node executing on a hardware appliance can be communicatively coupled, connected, cabled to, etc., e.g., 15 to 120 storage devices. Further, each ECS node can execute one or more services for performing data storage operations described herein, e.g., corresponding to data storage engine 110.

The ECS system is an append-only virtual storage platform that protects content from being erased or overwritten for a specified retention period. In particular, the ECS system does not employ traditional data protection schemes like mirroring or parity protection. Instead, the ECS system utilizes erasure coding for data protection, wherein data, a portion of the data, e.g., a data chunk, is broken into fragments, and expanded and encoded with redundant data pieces and then stored across a set of different locations or storage media, e.g., across different storage nodes.

The ECS system can support storage, manipulation, and/or analysis of unstructured data on a massive scale on commodity hardware. As an example, the ECS can support mobile, cloud, big data, and/or social networking applications. In another example, the ECS can be deployed as a turnkey storage appliance, or as a software product that can be installed on a set of qualified commodity servers and disks, e.g., within a node, data storage node, etc. of a cluster, data storage cluster, etc. In this regard, the ECS can comprise a cloud platform that comprises at least the following features: (i) lower cost than public clouds; (ii) unmatched combination of storage efficiency and data access; (iii) anywhere read/write access with strong consistency that simplifies application development; (iv) no single point of failure to increase availability and performance; (v) universal accessibility that eliminates storage silos and inefficient extract, transform, load (ETL)/data movement processes; etc.

Figure 2:
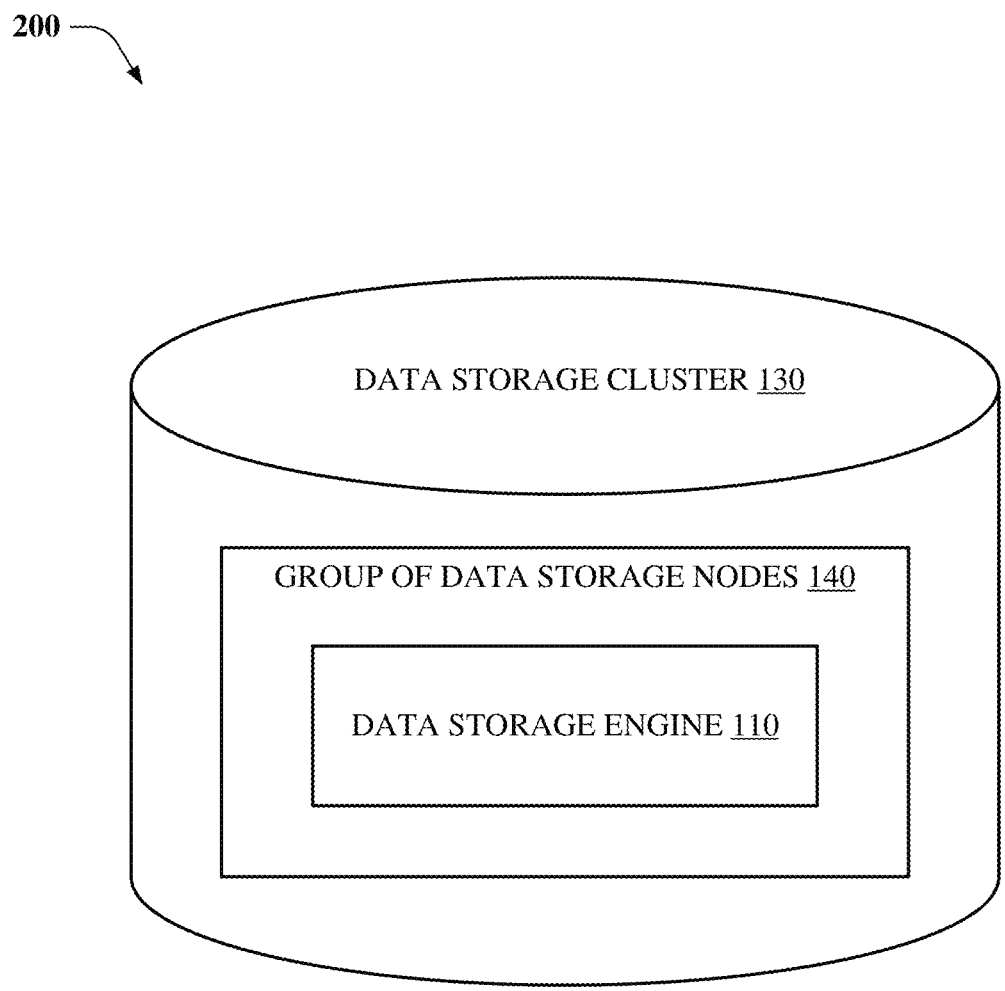
FIG. 2 illustrates a block diagram of a data storage cluster comprising a data storage engine, in accordance with various example embodiments.

In embodiment(s), the cloud-based data storage system can comprise an object storage system, e.g., a file system comprising, but not limited to comprising, a Dell EMC® Isilon file storage system. As illustrated by FIG. 2, a data storage engine (110) can be a part of a storage service layer (e.g., storage services illustrated by FIG. 9) of the cloud-based data storage system, and can handle data availability and protection against data corruption, hardware failure(s,) and/or data center disasters. In embodiment(s), the storage engine can be a distributed, shared service, storage service, etc. that can run on each node, ECS node, etc., e.g., within a group of data storage nodes (140) of a data storage cluster (130), e.g., an ECS cluster illustrated by FIG. 9, and can manage transactions and persists data to respective nodes.

As an example, the storage engine can write all object-related data, e.g., user data, metadata, object location data, etc. to logical containers of contiguous disk space, e.g., such containers comprising a group of blocks of fixed size (e.g., 128 MB) known as chunks. Data is stored in the chunks and the chunks can be shared, e.g., one chunk can comprise data fragments of different user objects. Chunk content is modified in append-only mode, e.g., such content being protected from being erased or overwritten for a specified retention period. When a chunk becomes full enough, it is sealed, closed, etc. In this regard, content of a sealed, closed, etc. chunk is immutable, e.g., read-only, and after the chunk is closed, the storage engine performs erasure-coding on the chunk.

Erasure coding is a method of data protection in which a data is broken into fragments, and the fragments are encoded with redundant coding fragments and stored across a set of different locations or storage media. During erasure coding, the storage engine can divide a data chunk into k data fragments, and encode the k data fragments to generate redundant m coding fragments. This protection scheme can be described as a k+m protection scheme. In an aspect, the fragments are encoded in a manner such that the system can tolerate the loss of any m fragments.

Normally, there is minimal sense in choosing such k and m, with k+m typically being less than or equal to the number of drives, storage devices, etc. in the cloud-based data storage system. In this case, m is the number of drive, storage device, etc. failures the storage system may endure without loss of user data. The greater the value for m, the higher the storage availability and durability. On the other hand, the greater the value for m, the higher the overhead on data protection. The overhead can be calculated as m/k. In order to keep the overhead reasonable, a greater m value can be compensated by a greater k value. However, the greater the sum k+m, the fewer the number (n) of node failures that can be endured by the storage system—n can be calculated using the equation below:

$$n = \min\left(\left\lfloor \frac{m+N}{k+m} \right\rfloor, m\right), \quad (1)$$

in which $N$ is the number of nodes in a cluster.

As an example, consider that a 10+2 (k+m) protection scheme is utilized for a cluster of six nodes (N). In this example scenario, the storage system can endure loss of any two drives or only one node. However, it is not possible to reduce capacity overhead on data protection via increasing k because this would make the system unable to endure even a single node failure. At least one node can store three or more data/coding fragments, while data recovery is not possible after more than two (m) fragments are lost. Thus, a protection scheme can be customized for a given storage system, which is described with the number or disks/nodes and/or their failure probabilities. Conventionally, storage systems can scale out while a protection scheme—once chosen—remains the same. For example, in an ECS, the number of nodes can change from four to hundreds. If a specific protection scheme is chosen for an initial/small cluster configuration, oftentimes the scheme does not meet the requirements for a final/large cluster configuration (and vice versa).

Specifically, larger clusters have higher statistical probability of multiple failures, so they require greater m values. In this regard, when m is chosen for a small cluster, data availability may be below the mark after the cluster grows larger, e.g., when additional storage node(s) are added to the cluster. On the other hand, when m is chosen for a large cluster, the protection scheme may not meet requirements for capacity use efficiency while the cluster remains small.

To address these and other concerns of conventional storage technologies, the following provides context for various embodiment(s) disclosed herein that can reduce storage system processing overhead and use of valuable storage device bandwidth in an erasure coding storage environment by performing partial encoding for a data storage cluster.

Suppose there is a protection scheme k+m, with a corresponding coding matrix m×k that is used to produce m coding fragments out of k data fragments. Further, any sub-matrix l×k of the coding m matrix m×k (where l<m) is a proper coding matrix for a protection scheme k+l, with m–l coding fragments being unavailable. For example, the following equations represent two coding matrices that are valid for the protection schemes 4+2 and 4+1, and that share values of coefficients $X_{i,j}$ with the same i and j:

$$CM = \begin{vmatrix} X_{1,1} & X_{1,2} & X_{1,3} & X_{1,4} \\ X_{2,1} & X_{2,2} & X_{2,3} & X_{2,4} \end{vmatrix} \quad (2)$$

corresponding to a (4 + 2) protection scheme, and $$CM = | X_{1,1} \quad X_{1,2} \quad X_{1,3} \quad X_{1,4} | \quad (3)$$

corresponding to a (4 + 1) protection scheme.

Using the above observations, when a new storage system is being designed, initiated, etc., a potential final, target, etc. protection scheme of $k+m_f$ corresponding to a coding matrix $m_f \times k$, in which $m_f$ is a large value, can be selected for the new storage system based on an anticipated, potential, etc. future expansion of the system.

In turn, an initial protection scheme $k+m_1$, in which $m_1 < m_f$, can be selected for an initial cluster configuration of the new storage system—based on an initial number of disk drives, storage media, etc. that have been determined to have been included in the new storage system. In this regard, $m_1$ can be selected to assure data recovery after $m_1$ disk failures—assuring a required level of data availability for the initial cluster configuration. Further, the initial protection scheme $k+m_1$ can be used for all new data while such storage system keeps its initial size. Accordingly, the coding matrix $m_1 \times k$ can be used for the initial protection scheme, and can comprise a sub-matrix of the coding matrix $m_f \times k$ that has been selected for the potential final, target, etc. protection scheme $k+m_f$.

When the new storage system gets expanded to obtain an expanded storage system, a statistical probability of multiple failures increases. Accordingly, a new protection scheme $k+m_{modified}$, in which $m_{modified}=m_1+m_2$ ($m_2$ being an amount of coding fragments for a second group of coding fragments that is different than the first group of coding fragments, can be selected for the expanded storage system, e.g., based on a number disk drives, storage media, etc. determined to have been added to the expanded storage system. In this regard, $m_{modified}$ can be selected to assure data recovery after $m_1+m_2$ disk failures—assuring a required level of data availability for the expanded storage system. Accordingly, the coding matrix $m_{modified} \times k$ can be used for the expanded storage system, and can comprise a sub-matrix of the coding matrix $m_f \times k$—the coding matrix $m_1 \times k$ of the initial protection scheme being a sub-matrix of the coding matrix $m_{modified} \times k$ of the expanded storage system. It should be appreciated that only $m_{modified}-m_1$ new coding fragments, e.g., $m_2$ new coding fragments, need to be produced for existing data portions, and a protection scheme stops scaling after a value of another $m_i$ (or $m_{modified}$) reaches $m_f$.

In this regard, and now referring to FIG. 1, a data storage engine (110) can comprise a re-protection component (120) that can determine an initial protection scheme for an initial stage of a data storage cluster (130) based on an initial number of storage devices that have been determined to have been included in the initial stage, e.g., which have been determined to have been included in a group of data storage nodes (140) of the data storage cluster.

In embodiment(s), the initial protection scheme can comprise an erasure coding-based protection scheme "k+m" in which data, e.g., comprising a data block that has been divided into k data fragments that have been stored within the data storage cluster, and redundant m coding fragments are created for the data block during encoding. In this regard, the initial protection scheme comprises determining a first group of coding fragments (e.g., an $m_1$ amount of coding fragments) for the data block, e.g., for the k data fragments, to facilitate a first recovery, from the initial stage, of the data using the first group of coding fragments.

Figure 3:
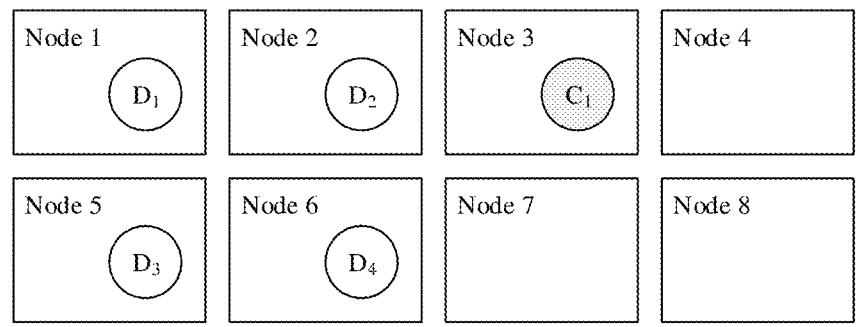
FIG. 3 illustrates a block diagram of a protection scheme that has been selected for an initial configuration of a data storage cluster in which data fragments of a portion of data have been stored at different storage nodes of the data storage cluster, in accordance with various example embodiments.

For example, and now referring to FIG. 3, the re-protection component (120) can select, for an initial configuration of a data storage cluster comprising 8 nodes, an initial data protection scheme of "4+1" for a portion of data (D). In this regard, the re-protection component can divide the portion of data into 4 data fragments $D_1$-$D_4$, determine 1 coding fragment $C_1$ for the portion of data, and store the data fragments and the coding fragment to different nodes of the data storage cluster.

Figure 4:
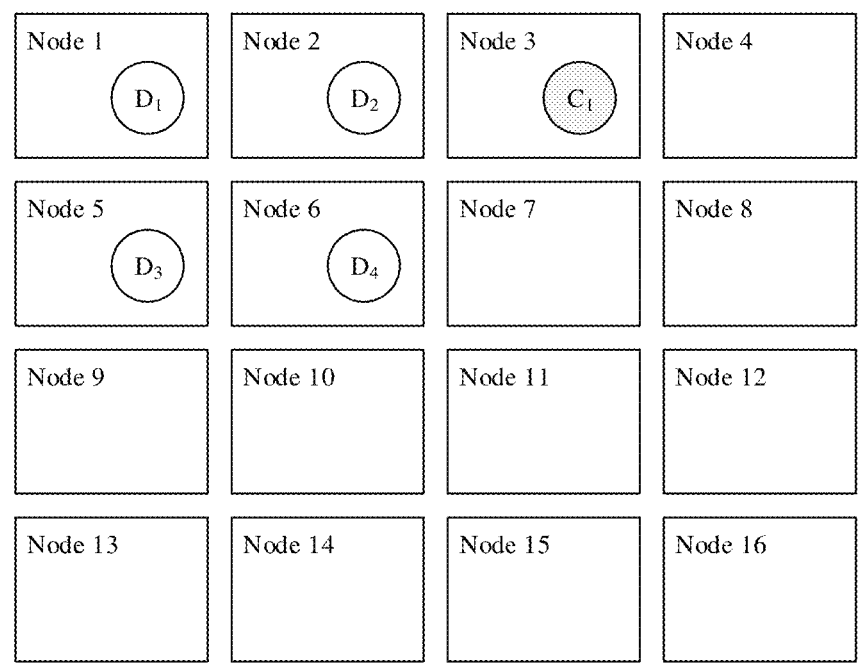
FIG. 4 illustrates a block diagram of a data storage cluster after storage nodes have been added to the data storage cluster, in accordance with various example embodiments.

Referring now to FIG. 4, in response to a defined number of additional storage devices, nodes, etc. being determined to have been added to the data storage cluster to generate a modified data storage cluster, the re-protection component can modify the initial protection scheme to obtain a modified, e.g., erasure coding-based, protection scheme "$k+m_{modified}$" for the modified data storage cluster. In this regard, the modified protection scheme comprises determining a second group of coding fragments (e.g., an $m_2$ amount of coding fragments in which $m_{modified}=m_1+m_2$), different than the first group of coding fragments, for the data block, e.g., for the k data fragments, to facilitate a second recovery, from the modified data storage cluster, of the data using the first group of coding fragments and the second group of coding fragments.

Figure 5:
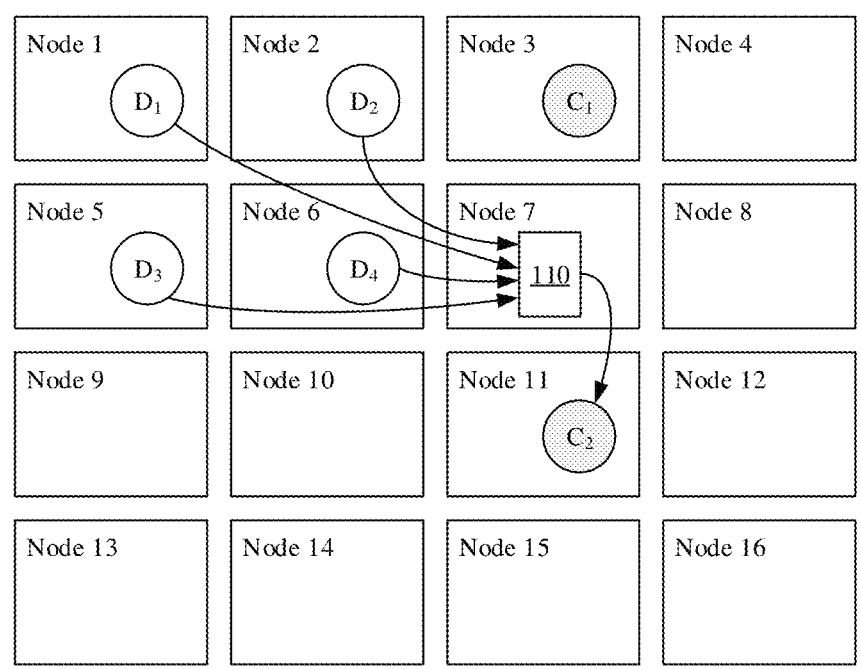
FIG. 5 illustrates a block diagram of a re-protection component of a data storage engine performing partial encoding for a data storage cluster, in accordance with various example embodiments.
Figure 6:
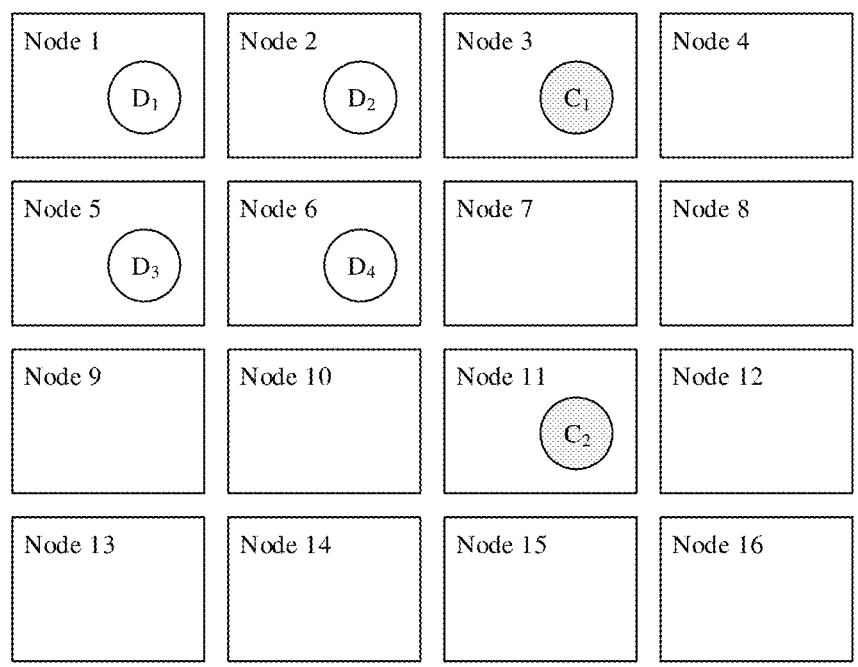
FIG. 6 illustrates a block diagram of a data storage cluster after partial encoding has been performed for the data storage cluster.

For example, as illustrated by FIG. 4, in response to determining that 8 nodes have been added to the data storage cluster to generate a modified data storage cluster comprising 16 nodes, the re-protection component can select, for the modified data storage cluster, a new, modified, etc. data protection scheme of "4+2" for the portion of data. In this regard, and now referring to FIGS. 5 and 6, the re-protection component can perform partial encoding for the 4 data fragments $D_1$-$D_4$ by only generating 1 missing coding fragment $C_2$, and storing such coding fragment to a different storage node—keeping the previously generated coding fragment $C_1$ stored in node 3.

In an embodiment, $m_{modified}$ is less than or equal to a defined upper limit (e.g., $m_f$) for a number of coding fragments for the data. Further, the $m_1$ amount of coding fragments of the first group of coding fragments is less than $m_{modified}$.

In turn, the re-protection component can recover the data from the modified data storage cluster using the first stored portion (e.g., $m_1$ amount) of coding fragments and the second stored portion (e.g., $m_2$ amount) of coding fragments, e.g., based on the k data fragments that have been stored within the data storage cluster.

In yet another embodiment, a target, e.g., potential final, coding matrix "$m_f$×k" is based on the defined upper limit (e.g., $m_f$) for the number of coding fragments for the data and a defined amount (e.g., k) of data fragments representing the data. In this regard, the potential final coding matrix comprises a first coding matrix, sub-matrix, etc. "$m_1$×k" corresponding to the initial stage of the data storage cluster—the first coding matrix based on the defined amount (e.g., k) of data fragments and the first amount (e.g., $m_1$) of coding fragments of the first group of coding fragments. Further, the potential final coding matrix comprises a second coding matrix, sub-matrix, etc. "$m_{modified}$×k" corresponding to the modified data storage cluster—the second coding matrix based on the defined amount (e.g., k) of data fragments and the second amount (e.g., $m_2$) of coding fragments of the second group of coding fragments. In this regard, the second sub-matrix comprises the first sub-matrix, e.g., the first sub-matrix is a subset of the second sub-matrix.

Figure 7:
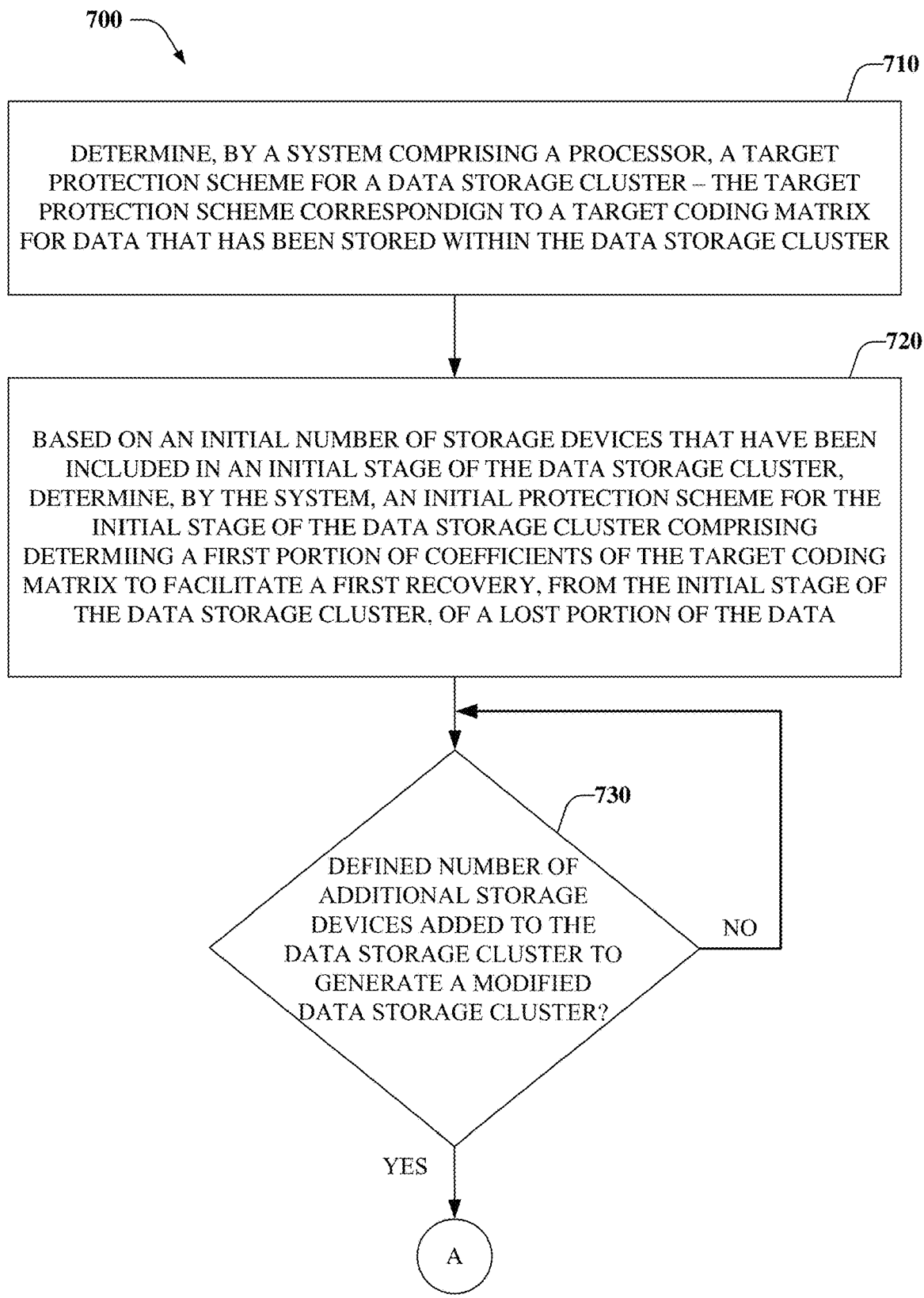
FIGS. 7-8 illustrate flow charts of a method associated with a data storage engine for facilitating scale out data protection with erasure coding, in accordance with various example embodiments.
Figure 8:
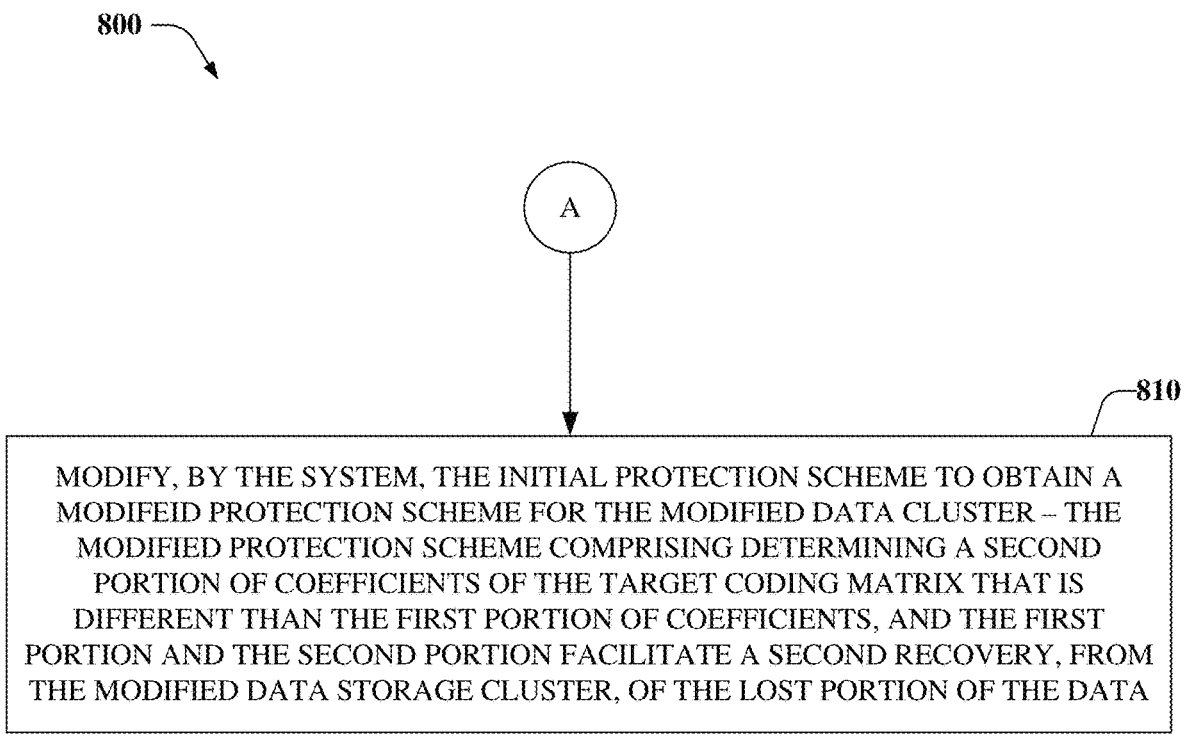

FIGS. 7-8 illustrate a methodology for performing operations corresponding to a cloud-based storage system (100), in accordance with various example embodiments. For simplicity of explanation, the methodologies are depicted and described as a series of acts. It is to be understood and appreciated that various embodiments disclosed herein are not limited by the acts illustrated and/or by the order of acts. For example, acts can occur in various orders and/or concurrently, and with other acts not presented or described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Referring now to FIGS. 7 and 8, a methodology for performing operations corresponding to a cloud-based storage system is illustrated, in accordance with various example embodiments. At 710, a system comprising a processor (e.g., 100), can determine target protection scheme for a data storage cluster—target protection scheme corresponding to a target coding matrix for data that has been stored within the data storage cluster. At 720, based on an initial number of storage devices that have been included in an initial stage of the data storage cluster, the system can determine an initial protection scheme for the initial stage of the data storage cluster comprising determining a first portion of coefficients of the target coding matrix to facilitate a first recovery, from the initial stage of the data storage cluster, of a lost portion of the data.

At 730, it can be determined whether a defined number of additional storage devices have been added to the data storage cluster to generate a modified data storage cluster. In this regard, in response to a determination that the defined number of additional storage devices have been added to the data storage cluster, flow continues to 810, otherwise flow returns to 730.

At 810, the system can modify the initial protection scheme to obtain a modified protection scheme for the modified data cluster—the modified protection scheme comprising determining a second portion of coefficients of the target coding matrix that is different than the first portion of coefficients. In this regard, the first portion of coefficients and the second portion of coefficients facilitate a second recovery, from the modified data storage cluster, of the lost portion of the data.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

As utilized herein, the terms "logic," "logical," "logically," and the like are intended to refer to any information having the form of instruction signals and/or data that may be applied to direct the operation of a processor. Logic may be formed from signals stored in a device memory. Software is one example of such logic. Logic may also be comprised by digital and/or analog hardware circuits, for example, hardware circuits comprising logical AND, OR, XOR, NAND, NOR, and other logical operations. Logic may be formed from combinations of software and hardware. On a network, logic may be programmed on a server, or a complex of servers. A particular logic unit is not limited to a single logical location on the network.

As utilized herein, terms "component," "system," "engine", and the like are intended to refer to a computer-related entity, hardware, software (e.g., in execution), and/or firmware. For example, a component can be a processor, a process running on a processor, an object, an executable, a program, a storage device, and/or a computer. By way of illustration, an application running on a server, client, etc. and the server, client, etc. can be a component. One or more components can reside within a process, and a component can be localized on one computer and/or distributed between two or more computers.

Further, components can execute from various computer readable media having various data structures stored thereon. The components can communicate via local and/or remote processes such as in accordance with a signal having one or more data packets (e.g., data from one component interacting with another component in a local system, distributed system, and/or across a network, e.g., the Internet, with other systems via the signal).

As another example, a component can be an apparatus with specific functionality provided by mechanical parts operated by electric or electronic circuitry; the electric or electronic circuitry can be operated by a software application or a firmware application executed by one or more processors; the one or more processors can be internal or external to the apparatus and can execute at least a part of the software or firmware application. In yet another example, a component can be an apparatus that provides specific functionality through electronic components without mechanical parts; the electronic components can comprise one or more processors therein to execute software and/or firmware that confer(s), at least in part, the functionality of the electronic components.

Aspects of systems, apparatus, and processes explained herein can constitute machine-executable instructions embodied within a machine, e.g., embodied in a computer readable medium (or media) associated with the machine. Such instructions, when executed by the machine, can cause the machine to perform the operations described. Additionally, the systems, processes, process blocks, etc. can be embodied within hardware, such as an application specific integrated circuit (ASIC) or the like. Moreover, the order in which some or all of the process blocks appear in each process should not be deemed limiting. Rather, it should be understood by a person of ordinary skill in the art having the benefit of the instant disclosure that some of the process blocks can be executed in a variety of orders not illustrated.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

The disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, computer-readable carrier, or computer-readable media. For example, computer-readable media can comprise, but are not limited to: random access memory (RAM); read only memory (ROM); electrically erasable programmable read only memory (EEPROM); flash memory or other memory technology (e.g., card, stick, key drive, thumb drive, smart card); solid state drive (SSD) or other solid-state storage technology; optical disk storage (e.g., compact disk (CD) read only memory (CD ROM), digital video/versatile disk (DVD), Blu-ray disc); cloud-based (e.g., Internet based) storage; magnetic storage (e.g., magnetic cassettes, magnetic tape, magnetic disk storage or other magnetic storage devices); a virtual device that emulates a storage device and/or any of the above computer-readable media; or other tangible and/or non-transitory media which can be used to store desired information. In this regard, the terms "tangible" or "non-transitory" herein as applied to storage, memory, or computer-readable media, are to be understood to exclude only propagating transitory signals per se as modifiers and do not relinquish rights to all standard storage, memory or computer-readable media that are not only propagating transitory signals per se.

Artificial intelligence based systems, e.g., utilizing explicitly and/or implicitly trained classifiers, can be employed in connection with performing inference and/or probabilistic determinations and/or statistical-based determinations as in accordance with one or more aspects of the disclosed subject matter as described herein. For example, an artificial intelligence system can be used, via batch mode data storage system 125, to store a batch of objects in a group of data chunks, and based on a determination that respective data chunks of the group of data chunks contain a defined amount of data, seal, erasure encode, and replicate the respective data chunks, as described herein.

A classifier can be a function that maps an input attribute vector, $x=(x1, x2, x3, x4, xn)$, to a confidence that the input belongs to a class, that is, $f(x)$=confidence (class). Such classification can employ a probabilistic and/or statistical-based analysis (e.g., factoring into the analysis utilities and costs) to infer an action that a user desires to be automatically performed. In the case of communication systems, for example, attributes can be information received from access points, servers, components of a wireless communication network, etc., and the classes can be categories or areas of interest (e.g., levels of priorities). A support vector machine is an example of a classifier that can be employed. The support vector machine operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein can also be inclusive of statistical regression that is utilized to develop models of priority.

In accordance with various aspects of the subject specification, artificial intelligence based systems, components, etc. can employ classifiers that are explicitly trained, e.g., via a generic training data, etc. as well as implicitly trained, e.g., via observing characteristics of communication equipment, e.g., a server, etc., receiving reports from such communication equipment, receiving operator preferences, receiving historical information, receiving extrinsic information, etc. For example, support vector machines can be configured via a learning or training phase within a classifier constructor and feature selection module. Thus, the classifier(s) can be used by an artificial intelligence system to automatically learn and perform a number of functions, e.g., performed by data storage engine 110.

As used herein, the term "infer" or "inference" refers generally to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference can be employed to identify a specific context or action, or can generate a probability distribution over states of interest based on a consideration of data and events, for example.

Inference can also refer to techniques employed for composing higher-level events from a set of events and/or data. Such inference results in the construction of new events or actions from a set of observed events and/or stored event data, whether the events are correlated in close temporal proximity, and whether the events and data come from one or several event and data sources. Various classification schemes and/or systems (e.g., support vector machines, neural networks, expert systems, Bayesian belief networks, fuzzy logic, and data fusion engines) can be employed in connection with performing automatic and/or inferred action in connection with the disclosed subject matter.

As it is employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions and/or processes described herein. Processors can exploit nano-scale architectures such as, but not limited to, molecular and quantum-dot based transistors, switches and gates, in order to optimize space usage or enhance performance of mobile devices. A processor may also be implemented as a combination of computing processing units.

In the subject specification, terms such as "store," "data store," "data storage," "database," "storage medium," "socket", and substantially any other information storage component relevant to operation and functionality of a system, component, and/or process, can refer to "memory components," or entities embodied in a "memory," or components comprising the memory. It will be appreciated that the memory components described herein can be either volatile memory or nonvolatile memory, or can comprise both volatile and nonvolatile memory.

By way of illustration, and not limitation, nonvolatile memory, for example, can be included in data storage cluster 130, non-volatile memory 1022 (see below), disk storage 1024 (see below), and/or memory storage 1046 (see below). Further, nonvolatile memory can be included in read only memory (ROM), programmable ROM (PROM), electrically programmable ROM (EPROM), electrically erasable ROM (EEPROM), or flash memory. Volatile memory 1020 can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Figure 10:
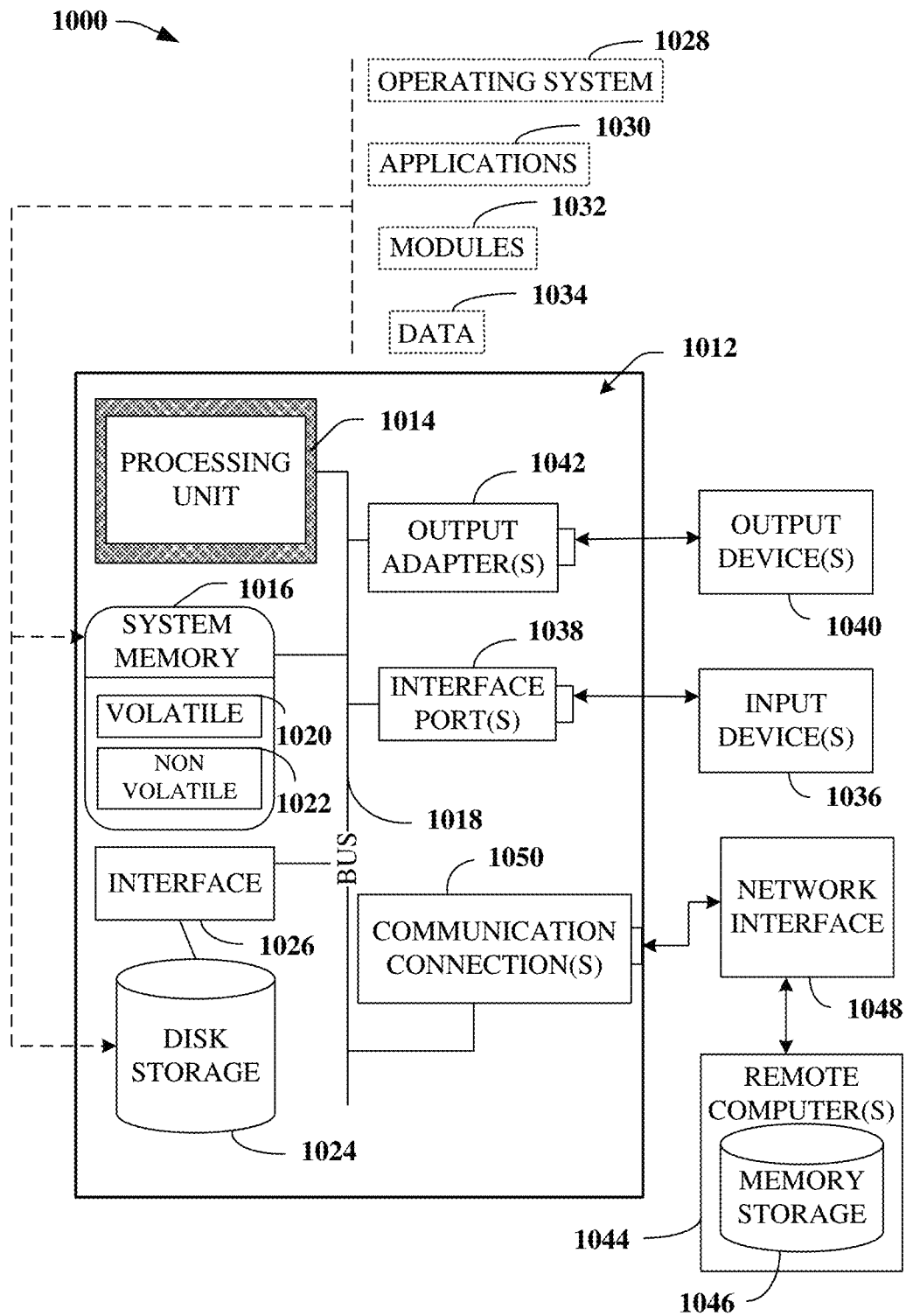
FIG. 10 illustrates a block diagram representing an illustrative non-limiting computing system or operating environment in which one or more aspects of various embodiments described herein can be implemented.

In order to provide a context for the various aspects of the disclosed subject matter, FIG. 10, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that various embodiments disclosed herein can be implemented in combination with other program modules. Generally, program modules comprise routines, programs, components, data structures, etc. that perform particular tasks and/or implement particular abstract data types.

Moreover, those skilled in the art will appreciate that the inventive systems can be practiced with other computer system configurations, comprising single-processor or multiprocessor computer systems, computing devices, mini-computing devices, mainframe computers, as well as personal computers, hand-held computing devices (e.g., PDA, phone, watch), microprocessor-based or programmable consumer or industrial electronics, and the like. The illustrated aspects can also be practiced in distributed computing environments where tasks are performed by remote processing devices that are linked through a communication network; however, some if not all aspects of the subject disclosure can be practiced on stand-alone computers. In a distributed computing environment, program modules can be located in both local and remote memory storage devices.

With reference to FIG. 10, a block diagram of a computing system 1000, e.g., data recovery system 110, operable to execute the disclosed systems and methods is illustrated, in accordance with an embodiment. Computer 1012 comprises a processing unit 1014, a system memory 1016, and a system bus 1018. System bus 1018 couples system components comprising, but not limited to, system memory 1016 to processing unit 1014. Processing unit 1014 can be any of various available processors. Dual microprocessors and other multiprocessor architectures also can be employed as processing unit 1014.

System bus 1018 can be any of several types of bus structure(s) comprising a memory bus or a memory controller, a peripheral bus or an external bus, and/or a local bus using any variety of available bus architectures comprising, but not limited to, industrial standard architecture (ISA), micro-channel architecture (MSA), extended ISA (EISA), intelligent drive electronics (IDE), VESA local bus (VLB), peripheral component interconnect (PCI), card bus, universal serial bus (USB), advanced graphics port (AGP), personal computer memory card international association bus (PCMCIA), Firewire (IEEE 1394), small computer systems interface (SCSI), and/or controller area network (CAN) bus used in vehicles.

System memory 1016 comprises volatile memory 1020 and nonvolatile memory 1022. A basic input/output system (BIOS), containing routines to transfer information between elements within computer 1012, such as during start-up, can be stored in nonvolatile memory 1022. By way of illustration, and not limitation, nonvolatile memory 1022 can comprise ROM, PROM, EPROM, EEPROM, or flash memory. Volatile memory 1020 comprises RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1012 also comprises removable/non-removable, volatile/non-volatile computer storage media. FIG. 10 illustrates, for example, disk storage 1024. Disk storage 1024 comprises, but is not limited to, devices like a magnetic disk drive, floppy disk drive, tape drive, Jaz drive, Zip drive, LS-100 drive, flash memory card, or memory stick. In addition, disk storage 1024 can comprise storage media separately or in combination with other storage media comprising, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1024 to system bus 1018, a removable or non-removable interface is typically used, such as interface 1026.

It is to be appreciated that FIG. 10 describes software that acts as an intermediary between users and computer resources described in suitable operating environment 1000. Such software comprises an operating system 1028. Operating system 1028, which can be stored on disk storage 1024, acts to control and allocate resources of computer system 1012. System applications 1030 take advantage of the management of resources by operating system 1028 through program modules 1032 and program data 1034 stored either in system memory 1016 or on disk storage 1024. It is to be appreciated that the disclosed subject matter can be implemented with various operating systems or combinations of operating systems.

A user can enter commands or information into computer 1012 through input device(s) 1036. Input devices 1036 comprise, but are not limited to, a pointing device such as a mouse, trackball, stylus, touch pad, keyboard, microphone, joystick, game pad, satellite dish, scanner, TV tuner card, digital camera, digital video camera, web camera, cellular phone, user equipment, smartphone, and the like. These and other input devices connect to processing unit 1014 through system bus 1018 via interface port(s) 1038. Interface port(s) 1038 comprise, for example, a serial port, a parallel port, a game port, a universal serial bus (USB), a wireless based port, e.g., Wi-Fi, Bluetooth, etc. Output device(s) 1040 use some of the same type of ports as input device(s) 1036.

Thus, for example, a USB port can be used to provide input to computer 1012 and to output information from computer 1012 to an output device 1040. Output adapter 1042 is provided to illustrate that there are some output devices 1040, like display devices, light projection devices, monitors, speakers, and printers, among other output devices 1040, which use special adapters. Output adapters 1042 comprise, by way of illustration and not limitation, video and sound devices, cards, etc. that provide means of connection between output device 1040 and system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. Remote computer(s) 1044 can be a personal computer, a server, a router, a network PC, a workstation, a microprocessor based appliance, a peer device, or other common network node and the like, and typically comprises many or all of the elements described relative to computer 1012.

For purposes of brevity, only a memory storage device 1046 is illustrated with remote computer(s) 1044. Remote computer(s) 1044 is logically connected to computer 1012 through a network interface 1048 and then physically and/or wirelessly connected via communication connection 1050. Network interface 1048 encompasses wire and/or wireless communication networks such as local-area networks (LAN) and wide-area networks (WAN). LAN technologies comprise fiber distributed data interface (FDDI), copper distributed data interface (CDDI), Ethernet, token ring and the like. WAN technologies comprise, but are not limited to, point-to-point links, circuit switching networks like integrated services digital networks (ISDN) and variations thereon, packet switching networks, and digital subscriber lines (DSL).

Communication connection(s) 1050 refer(s) to hardware/software employed to connect network interface 1048 to bus 1018. While communication connection 1050 is shown for illustrative clarity inside computer 1012, it can also be external to computer 1012. The hardware/software for connection to network interface 1048 can comprise, for example, internal and external technologies such as modems, comprising regular telephone grade modems, cable modems and DSL modems, wireless modems, ISDN adapters, and Ethernet cards.

The computer 1012 can operate in a networked environment using logical connections via wired and/or wireless communications to one or more remote computers, cellular based devices, user equipment, smartphones, or other computing devices, such as workstations, server computers, routers, personal computers, portable computers, microprocessor-based entertainment appliances, peer devices or other common network nodes, etc. The computer 1012 can connect to other devices/networks by way of antenna, port, network interface adaptor, wireless access point, modem, and/or the like.

The computer 1012 is operable to communicate with any wireless devices or entities operatively disposed in wireless communication, e.g., a printer, scanner, desktop and/or portable computer, portable data assistant, communications satellite, user equipment, cellular base device, smartphone, any piece of equipment or location associated with a wirelessly detectable tag (e.g., scanner, a kiosk, news stand, restroom), and telephone. This comprises at least Wi-Fi and Bluetooth wireless technologies. Thus, the communication can be a predefined structure as with a conventional network or simply an ad hoc communication between at least two devices.

Wi-Fi allows connection to the Internet from a desired location (e.g., a vehicle, couch at home, a bed in a hotel room, or a conference room at work, etc.) without wires. Wi-Fi is a wireless technology similar to that used in a cell phone that enables such devices, e.g., mobile phones, computers, etc., to send and receive data indoors and out, anywhere within the range of a base station. Wi-Fi networks use radio technologies called IEEE 802.11 (a, b, g, etc.) to provide secure, reliable, fast wireless connectivity. A Wi-Fi network can be used to connect communication devices (e.g., mobile phones, computers, etc.) to each other, to the Internet, and to wired networks (which use IEEE 802.3 or Ethernet). Wi-Fi networks operate in the unlicensed 2.4 and 5 GHz radio bands, at an 11 Mbps (802.11a) or 54 Mbps (802.11b) data rate, for example, or with products that contain both bands (dual band), so the networks can provide real-world performance similar to the basic 10BaseT wired Ethernet networks used in many offices.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A system, comprising:
a processor; and
a memory that stores executable instructions that, when executed by the processor, facilitate performance of operations, comprising:
based on an initial number of storage devices that have been determined to have been included in an initial stage of a data storage cluster, determining an initial protection scheme for the initial stage of the data storage cluster, wherein the initial protection scheme comprises determining a first group of coding fragments for data that has been stored within the data storage cluster to facilitate a first recovery, from the initial stage of the data storage cluster, of the data using the first group of coding fragments; and
in response to a defined number of additional storage devices being determined to have been added to the data storage cluster to generate a modified data storage cluster, modifying the initial protection scheme to obtain a modified protection scheme for the modified data storage cluster, wherein the modified protection scheme comprises determining a second group of coding fragments, different than the first group of coding fragments, for the data to facilitate a second recovery, from the modified data storage cluster, of the data using the first group of coding fragments and the second group of coding fragments.

2. The system of claim 1, wherein a sum of a first amount of coding fragments of the first group of coding fragments and a second amount of coding fragments of the second group of coding fragments is less than or equal to a defined upper limit for a number of coding fragments for the data.

3. The system of claim 1, wherein the initial protection scheme comprises:
storing the first group of coding fragments in the data storage cluster to obtain a first stored portion of coding fragments.

4. The system of claim 3, wherein the modified protection scheme comprises:
storing the second group of coding fragments in the data storage cluster to obtain a second stored portion of coding fragments.

5. The system of claim 4, wherein the operations further comprise:
recovering the data from the modified data storage cluster using the first stored portion of coding fragments and the second stored portion of coding fragments.

6. The system of claim 1, wherein the initial protection scheme and the modified protection scheme comprise an erasure coding-based protection scheme.

7. The system of claim 6, wherein a target coding matrix that is based on a defined upper limit for a number of coding fragments for the data and a defined amount of data fragments representing the data comprises a first sub-matrix corresponding to the initial stage of the data storage cluster and a second sub-matrix corresponding to the modified data storage cluster.

8. The system of claim 7, wherein the second sub-matrix comprises the first sub-matrix.

9. The system of claim 8, wherein the first sub-matrix is based on the defined amount of data fragments and a first amount of coding fragments of the first group of coding fragments, wherein the second sub-matrix is based on the defined amount of data fragments and a second amount of coding fragments of the second group of coding fragments, and wherein a sum of the first amount of coding fragments and the second amount of coding fragments is less than or equal to the defined upper limit for the number of coding fragments for the data.

10. A method, comprising:
determining, by a system comprising a processor, a target protection scheme for a data storage cluster, wherein the target protection scheme corresponds to a target coding matrix for data that has been stored within the data storage cluster;
based on an initial number of storage devices that have been included in an initial stage of the data storage cluster, determining, by the system, an initial protection scheme for the initial stage of the data storage cluster comprising determining a first portion of coefficients of the target coding matrix to facilitate a first recovery, from the initial stage of the data storage cluster, of a lost portion of the data; and
in response to determining that a defined number of additional storage devices have been added to the data storage cluster to generate a modified data storage cluster, modifying, by the system, the initial protection scheme to obtain a modified protection scheme for the modified data storage cluster, wherein the modified protection scheme comprises determining a second portion of coefficients of the target coding matrix that is different than the first portion of coefficients, and wherein the first portion of coefficients and the second portion of coefficients facilitate a second recovery, from the modified data storage cluster, of the lost portion of the data.

11. The method of claim 10, wherein the operations further comprise:
recovering, by the system, the lost portion of the data from the modified data storage cluster using the first portion of coefficients and the second portion of coefficients.

12. The method of claim 10, wherein the initial protection scheme and the modified protection scheme comprise an erasure coding-based protection scheme.

13. The method of claim 10, further comprising determining, by the system, the target coding matrix based on a defined upper limit for a number of coding fragments for the data and a defined number of data fragments representing the data.

14. The method of claim 13, wherein the determining the first portion of coefficients comprises determining the first portion of coefficients based on the defined number of data fragments representing the data.

15. The method of claim 14, wherein the determining the second portion of coefficients comprises determining the second portion of coefficients based on the defined number of data fragments representing the data.

16. A non-transitory machine-readable medium comprising instructions that, in response to execution, cause a system comprising a processor to perform operations, comprising:
    determining a target protection scheme for a data storage cluster, wherein the target protection scheme corresponds to a defined upper limit of coding fragments for data that has been stored within the data storage cluster;
    based on an initial number of storage devices that have been determined to have been included in an initial stage of the data storage cluster, determining an initial protection scheme for the initial stage of the data storage cluster comprising determining a first portion of the coding fragments to facilitate a first recovery, from the initial stage of the data storage cluster, of the data; and
    in response to a defined number of additional storage devices being determined to have been added to the data storage cluster to obtain a modified data storage cluster, modifying the initial protection scheme to obtain a modified protection scheme for the modified data storage cluster, wherein the modified protection scheme comprises determining a second portion of the coding fragments that is different than the first portion of the coding fragments, and wherein the first portion of the coding fragments and the second portion of the coding fragments facilitate a second recovery, from the modified data storage cluster, of the data.

17. The non-transitory machine-readable medium of claim 16, wherein the target protection scheme, the initial protection scheme, and the modified protection scheme comprise an erasure coding-based protection scheme.

18. The non-transitory machine-readable medium of claim 17, wherein the operations further comprise:
    storing the first portion of the coding fragments in the data storage cluster to obtain a first stored portion of the coding fragments; and
    storing the second portion of the coding fragments in the data storage cluster to obtain a second stored portion of the coding fragments.

19. The non-transitory machine-readable medium of claim 18, wherein the operations further comprise:
    recovering the data from the modified data storage cluster using the first stored portion of the coding fragments and the second stored portion of the coding fragments.

20. The non-transitory machine-readable medium of claim 19, wherein the first stored portion of the coding fragments and the second stored portion of the coding fragments correspond to a defined amount of data fragments representing the data.

* * * * *